United States Patent
Akedo et al.

(10) Patent No.: US 8,026,578 B2
(45) Date of Patent: Sep. 27, 2011

(54) BARRIER FILM AND METHOD OF PRODUCING BARRIER FILM

(75) Inventors: Kunio Akedo, Nagoya (JP); Atsushi Miura, Nagoya (JP); Koji Noda, Ichinomiya (JP); Hisayoshi Fujikawa, Seto (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 683 days.

(21) Appl. No.: 12/040,142

(22) Filed: Feb. 29, 2008

(65) Prior Publication Data
US 2008/0211066 A1    Sep. 4, 2008

(30) Foreign Application Priority Data
Mar. 1, 2007   (JP) ................. 2007-051748

(51) Int. Cl.
*H01L 23/58* (2006.01)
(52) U.S. Cl. .................. 257/640; 257/101
(58) Field of Classification Search .......... 257/98, 257/100, 101, 639, 640, E21.293
See application file for complete search history.

(56) References Cited

U.S. PATENT DOCUMENTS

| 5,306,946 A | 4/1994 | Yamamoto |
| 7,012,658 B2 * | 3/2006 | Sawasaki et al. ........... 349/43 |

FOREIGN PATENT DOCUMENTS

| JP | 5-6890 | 1/1993 |
| JP | 5-335345 | 12/1993 |
| JP | 6-291114 | 10/1994 |
| JP | 2002-158226 | 5/2002 |
| JP | 2004-63304 | 2/2004 |
| JP | 2005-222732 | 8/2005 |
| JP | 2005-222778 | 8/2005 |

OTHER PUBLICATIONS

Hirofumi Kubota, et al., "Organic LED full color passive-matrix display" Journal of Luminescence, 87-89, 2000, pp. 56-60.

* cited by examiner

*Primary Examiner* — Hung Vu
(74) *Attorney, Agent, or Firm* — Oblon, Spivak, McClelland, Maier & Neustadt, L.L.P.

(57) ABSTRACT

A barrier film formed on top of a substrate, a barrier film formed so as to cover a functional element region fabricated on top of a substrate, or a barrier film formed on both a substrate and a functional element region, wherein the barrier film includes at least one layer of a silicon nitride film formed by laminating two or more silicon nitride layers having different Si/N composition ratios.

6 Claims, 8 Drawing Sheets

BARRIER FILM AND METHOD OF PRODUCING BARRIER FILM

CROSS-REFERENCE TO RELATED APPLICATIONS

This application claims priority to Japanese Patent Application No. 2007-051748 filed on Mar. 1, 2007, which is incorporated herein by reference in its entirety.

BACKGROUND

1. Technical Field

The present invention relates to a barrier film and a method of producing a barrier film.

2. Related Art

Silicon nitride films fabricated by parallel plate RF plasma CVD methods using silane gas, ammonia gas and nitrogen gas and the like as raw materials are used as passivation films for semiconductors. When a silicon nitride film is to be used as a barrier film for a low glass transition temperature (Tg) material such as a resin or an organic thin film, film formation must be conducted at high speed, and at a low substrate temperature of approximately 200° C. or lower. However, silicon nitride films formed under these types of conditions may oxidize under conditions of high temperature and high humidity, causing a deterioration in the barrier properties.

H. Kubota et al. have proposed a technique, in Journal of Luminescence, 2000, 87 to 89, page 56, in which a silicon nitride film is formed using only silane gas and nitrogen gas, without the use of ammonia gas. Furthermore, JP 05-6890 A, JP 05-335345 A, JP 06-291114 A and JP 2002-158226 A have proposed the lamination of a plurality of silicon nitride films with differing properties. Moreover, JP 2004-63304 A and JP 2005-222732 A have proposed applications of laminated structures containing a plurality of silicon nitride films with differing properties formed at a low substrate temperature to organic electroluminescent elements.

However, with the method disclosed by Kubota et al. in Journal of Luminescence, 2000, 87 to 89, page 56, the resulting silicon nitride film tends to suffer from large quantities of pinholes and the formation of dark spots, and the color of the silicon nitride film is brown, meaning use of the film in optical applications or as a barrier film is problematic. Forming this type of silicon nitride film with a thin enough film thickness (for example, 50 nm or less) to prevent any significant deterioration in the optical transmittance is one possible technique, but reducing the film thickness raises other problems such as a deterioration in the coating properties and an increase in the number of pinholes.

Furthermore, the methods disclosed in JP 05-6890 A, JP 05-335345 A and JP 2002-158226 A are all designed with the purpose of controlling the level of internal stress and the hydrogen content when film formation is conducted at a high substrate temperature of approximately 240 to 400° C., and make no reference to the conditions required for suppressing oxidation of the film at low substrate temperatures, simply because the film undergoes almost no oxidation under high substrate temperature conditions. JP 05-6890 A describes the internal compressive stress and the hydrogen content, but the level of stress and the hydrogen content are not essential factors in suppressing oxidation of the film at low substrate temperatures. JP 05-335345 A and JP 2002-158226 A describe the hydrogen content and the refractive index, but these are also not essential factors. JP 06-291114 A describes the ratio between the peak surface areas for N—H bonds and Si—H bonds within the infrared absorption spectrum for the film (namely, the ratio N—H/Si—H), but under the prescribed conditions of a ratio of 2 or less, oxidation of the film cannot be suppressed.

JP 2004-63304 A and JP 2005-222732 A have been designed with the purpose of controlling the stress within the film, and use only silane, nitrogen and hydrogen gases as the film formation gases, without the use of ammonia. Furthermore, although reference is made to Si—H bonds, the Si—H bonds are not an essential factor in improving the oxidation resistance, and oxidation of the film cannot be suppressed based solely on this factor.

The present invention provides a barrier film and a method of producing the barrier film that exhibit superior resistance to oxidation under conditions of high temperature and high humidity, suffer from minimal pinholes, and exhibit a high degree of optical transmittance.

SUMMARY

The present invention relates to a barrier film formed on top of a substrate, a barrier film formed so as to cover a functional element region fabricated on top of a substrate, or a barrier film formed on both a substrate and a functional element region, wherein the barrier film includes at least one layer of a silicon nitride film formed by laminating two or more silicon nitride layers having different Si/N composition ratios.

In this aspect of the present invention, by ensuring that the barrier film includes at least one layer of a silicon nitride film formed by laminating two or more silicon nitride layers having different Si/N composition ratios, a barrier film can be provided that exhibits superior resistance to oxidation under conditions of high temperature and high humidity, suffers from minimal pinholes, and exhibits a high degree of optical transmittance.

Furthermore, the present invention also relates to a method of producing a barrier film formed on top of a substrate, a barrier film formed so as to cover a functional element region fabricated on top of a substrate, or a barrier film formed on both a substrate and a functional element region, wherein the barrier film includes at least one layer of a silicon nitride film formed by laminating two or more silicon nitride layers having different Si/N composition ratios, and the method includes forming of a silicon nitride layer of forming the silicon nitride layers at a substrate temperature of not more than approximately 200° C., using a plasma CVD method that employs a gas containing silane gas, ammonia gas and a carrier gas as a raw material, in which the silicon nitride layers are formed by altering the flow rate ratio of the ammonia gas relative to the silane gas.

In this aspect of the present invention, by ensuring that the barrier film includes at least one layer of a silicon nitride film formed by laminating two or more silicon nitride layers having different Si/N composition ratios, a method of producing a barrier film that exhibits superior resistance to oxidation under conditions of high temperature and high humidity, suffers from minimal pinholes, and exhibits a high degree of optical transmittance can be provided.

BRIEF DESCRIPTION OF THE DRAWINGS

Exemplary embodiments of the present invention will be described in detail by reference to the following figures, wherein.

DETAILED DESCRIPTION

Embodiments of the present invention are described below. The embodiments of the present invention are merely examples of implementing the present invention, and the present invention is in no way limited by these embodiments.

The inventors of the present invention discovered that by ensuring that a barrier film includes at least one layer of a silicon nitride film formed by laminating two or more silicon nitride layers having different Si/N composition ratios, a barrier film could be obtained that exhibits superior resistance to oxidation under conditions of high temperature and high humidity, a high degree of barrier properties relative to moisture and oxygen and the like, minimal pinholes, and a high degree of optical transmittance.

Figure 1:
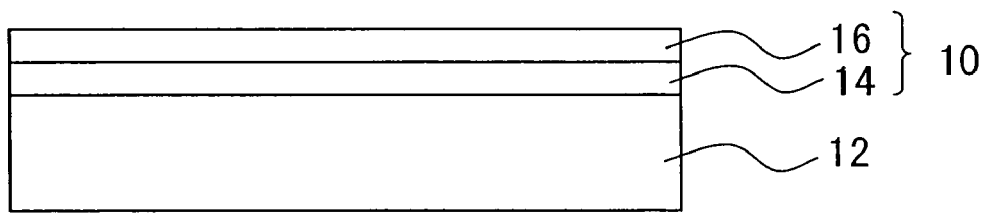
FIG. 1 is a schematic cross-sectional view showing an example of the structure of a barrier film according to an embodiment of the present invention.

A schematic cross-sectional view of one example of a barrier film according to an embodiment of the present invention is shown in FIG. 1. The barrier film 10 is formed on top of a substrate 12, and includes at least one layer of a silicon nitride film formed by laminating two or more silicon nitride layers, wherein each silicon nitride layer has a different Si/N composition ratio. In the example shown in FIG. 1, two silicon nitride layers 14 and 16 having different Si/N composition ratios are formed on top of the substrate 12, but the present invention is not limited to this case, and 3 or more layers may also be formed on the substrate. Furthermore, additional layers of the silicon nitride layers 14 and 16 having different Si/N composition ratios may also be laminated to the substrate.

To ensure an improvement in the oxidation resistance of a film formed at a low substrate temperature, the Si/N composition ratios for the silicon nitride layers 14 and 16 need be different, but laminating a layer with a comparatively smaller Si/N composition ratio to the substrate 12 as the silicon nitride layer 14, and then laminating a layer with a Si/N composition ratio that is larger than that of the silicon nitride layer 14 to the top of the silicon nitride layer 14 as the silicon nitride layer 16 is preferred. Because the layer with a larger Si/N composition ratio functions as an oxidation prevention layer, it may prevent oxidation of the layer with a comparatively smaller Si/N composition ratio, and the interface between the two layers may suppress pinhole formation and enables the barrier properties to be maintained at a higher level.

In other words, because the silicon nitride layer with the comparatively smaller Si/N composition ratio contributes to the film thickness, a barrier film with favorable coating properties can be formed. Moreover, because the layers are formed from the same materials, there may be almost no interfacial diffusion of moisture or oxygen, and because the oxidation rate of the silicon nitride layer with the larger Si/N composition ratio is extremely slow, there may be almost no need to consider oxidation within the in-plane direction of the substrate. Furthermore, by overlaying another layer with a comparatively smaller Si/N composition ratio and another layer with a larger Si/N composition ratio, the barrier properties can be improved even further. Moreover, even when the silicon nitride layers are formed at a low substrate temperature, the barrier properties can be maintained for considerably long periods under conditions of high temperature and high humidity, meaning a barrier film can be formed in situations where heat resistance is a problem, or on all manner of substrates for which shape restrictions prevent the temperature from being raised.

Furthermore, to ensure an improvement in the oxidation resistance of a film formed at a low substrate temperature, the Si/N composition ratios for the silicon nitride layers 14 and 16 need be different, but in order to further improve the oxidation resistance, the Si/N composition ratio for each layer is preferably set to an appropriate value, and laminating a layer with a Si/N composition ratio of not more than approximately 1.4, and a layer with a Si/N composition ratio that is greater than approximately 1.4 is preferred. Furthermore, laminating a layer with a Si/N composition ratio of not more than approximately 1.4 to the substrate 12 as the silicon nitride layer 14, and then laminating a layer with a Si/N composition ratio that is greater than approximately 1.4 to the top of the silicon nitride layer 14 as the silicon nitride layer 16 is preferred.

Laminating the silicon nitride layers with different Si/N composition ratios directly together, so that the interfaces of the silicon nitride layers are joined in a continuous manner may be important, but similar properties can be achieved regardless of whether the join yields a stepwise variation in the Si/N composition ratio or a continuous variation in the Si/N composition ratio.

Although there are no particular restrictions on the film thickness values for the silicon nitride layers 14 and 16, the film thickness of each layer with a Si/N composition ratio of greater than approximately 1.4 is preferably not more than approximately 50 nm, and is even more preferably approximately 30 nm or less. If the film thickness of a single layer with a Si/N composition ratio of greater than approximately 1.4 exceeds approximately 50 nm, then achieving an optical transmittance of approximately 70% or more in the blue light region may become problematic, and if the film thickness exceeds approximately 30 nm, then achieving an optical transmittance of approximately 75% or more in the blue light region may become difficult, meaning the film may be unsuitable for optical applications. Furthermore, the film thickness of each layer with a Si/N composition ratio of greater than approximately 1.4 is preferably approximately 1 nm or greater. If the film thickness is approximately 1 nm or greater, then favorable barrier properties can be more readily achieved.

Furthermore, the film thickness of each layer with a Si/N composition ratio of not more than approximately 1.4 is preferably within a range from approximately 1 nm to approximately 10 μm, and is even more preferably within a range from approximately 10 nm to approximately 1 μm. If the film thickness of a single layer with a Si/N composition ratio of not more than approximately 1.4 exceeds 10 μm, then the film may become prone to peeling or cracking.

To ensure an improvement in the oxidation resistance of a film formed at a low substrate temperature, the Si/N composition ratios for the silicon nitride layers 14 and 16 need be different, but if, in a Fourier transform infrared absorption spectrum, the peak intensity in the vicinity of 3350 cm$^{-1}$ attributable to the N—H stretching vibration is termed A, the peak intensity in the vicinity of 860 cm$^{-1}$ attributable to the Si—N stretching vibration is termed B, and the peak intensity in the vicinity of 2160 cm$^{-1}$ attributable to the Si—H stretching vibration is termed C, then the values of A/B (the peak intensity ratio for N—H/Si—N) and A/C (the peak intensity ratio for N—H/Si—H) are preferably different.

Furthermore, although the values of A/B and A/C for the silicon nitride layers 14 and 16 need be different in order to ensure an improvement in the oxidation resistance of a film formed at a low substrate temperature, in order to further improve the oxidation resistance, the values of A/B and A/C for each layer are preferably set to appropriate values, and laminating a layer for which A/B is not more than approximately 0.08 and A/C is not more than approximately 0.3, with a different layer is preferred. Furthermore, laminating a layer other than a layer for which A/B is not more than approximately 0.08 and A/C is not more than approximately 0.3 to the substrate 12 as the silicon nitride layer 14, and then laminating a layer for which A/B is not more than approximately 0.08 and A/C is not more than approximately 0.3 to the top of the silicon nitride layer 14 as the silicon nitride layer 16 is preferred.

Accordingly, in order to ensure an improvement in the oxidation resistance of a film formed at a low substrate temperature, a layer with a Si/N composition ratio of not more than approximately 1.4, which is different from a layer for which A/B is not more than approximately 0.08 and A/C is not more than approximately 0.3 is preferably laminated to the substrate 12 as the silicon nitride layer 14, and a layer with a Si/N composition ratio of greater than approximately 1.4 in which A/B is not more than approximately 0.08 and A/C is not more than approximately 0.3 is preferably laminated to the silicon nitride layer 14 as the silicon nitride layer 16.

Furthermore, the film thickness of each layer for which A/B is not more than approximately 0.08 and A/C is not more than approximately 0.3 is preferably not more than approximately 50 nm, and even more preferably approximately 30 nm or less. If the film thickness of a single layer for which A/B is not more than approximately 0.08 and A/C is not more than approximately 0.3 exceeds approximately 50 nm, then achieving an optical transmittance of approximately 70% or more in the blue light region may become problematic, and if the film thickness exceeds approximately 30 nm, then achieving an optical transmittance of approximately 75% or more in the blue light region may become difficult, meaning the film may be unsuitable for optical applications. Furthermore, the film thickness of each layer for which A/B is not more than approximately 0.08 and A/C is not more than approximately 0.3 is preferably approximately 1 nm or greater. Provided the film thickness is approximately 1 nm or greater, favorable barrier properties can be more readily achieved.

The barrier film 10 is preferably formed at a substrate temperature of approximately 200° C. or lower. If the barrier film 10 is formed at a substrate temperature that exceeds approximately 200° C., then N—H bonds and Si—H bonds within the silicon nitride film may undergo cleavage, meaning the aforementioned Si/N composition ratio and/or the A/B and A/C conditions cannot be satisfied. The barrier film 10 is preferably formed at a substrate temperature of at least approximately room temperature (25° C.).

At least one of a glass, a resin, and a semiconductor can be used as the substrate 12.

Figure 2:
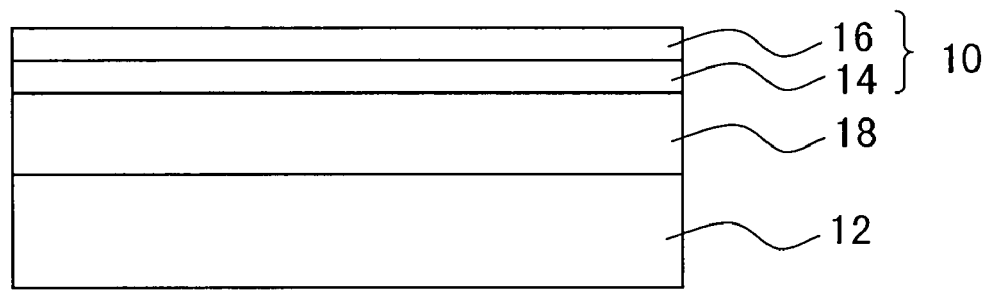
FIG. 2 is a schematic cross-sectional view showing another example of the structure of a barrier film according to an embodiment of the present invention.
Figure 3:
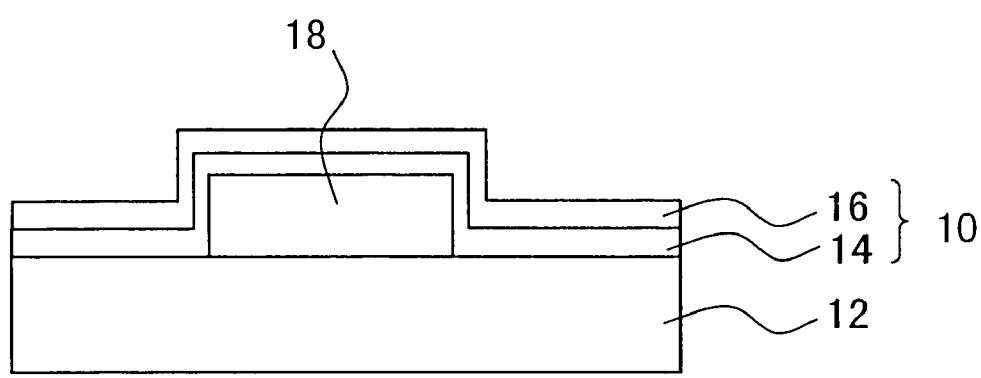
FIG. 3 is a schematic cross-sectional view showing yet another example of the structure of a barrier film according to an embodiment of the present invention.

Schematic cross-sectional views of other examples of barrier films according to embodiments of the present invention are shown in FIG. 2 and FIG. 3. In FIG. 2, the barrier film 10 is formed so as to cover the region of a functional element 18 provided on top of the substrate 12, and includes at least one layer of a silicon nitride film formed by laminating two or more silicon nitride layers, wherein each silicon nitride layer has a different Si/N composition ratio. In FIG. 3, the barrier film 10 is formed so as to cover both the substrate 12 and the region of a functional element 18 provided on top of the substrate 12, and includes at least one layer of a silicon nitride film formed by laminating two or more silicon nitride layers, wherein each silicon nitride layer has a different Si/N composition ratio.

The functional element is preferably an electronic functional element or an optical functional element. Of the various electronic functional elements, organic electronic elements are preferred, and the organic electronic element is preferably at least one element selected from amongst organic electroluminescent elements, organic transistors, organic solar cells, liquid crystal display elements, and electronic papers. Using the barrier film according to this embodiment, a barrier film that exhibits a high degree of barrier properties relative to moisture and oxygen and the like even under conditions of high temperature and high humidity, suffers from minimal pinholes, and exhibits a high degree of optical transmittance can be provided on top of a low Tg material such as a resin or an organic thin film at a favorable level of productivity. This enables the development of flexible organic electroluminescent displays and flexible organic solar cells.

A method of producing a barrier film according to an embodiment of the present invention is described below.

A method of producing a barrier film according to an embodiment of the present invention preferably includes forming of a silicon nitride layer of forming silicon nitride layers at a substrate temperature of not more than approximately 200° C., using a plasma CVD method that employs a gas containing silane gas, ammonia gas and a carrier gas as a raw material, in which the silicon nitride layers are formed by altering the flow rate ratio of the ammonia gas relative to the silane gas (NH$_3$/Si). By using this method, a barrier film 10 that includes a silicon nitride film formed by laminating two or more silicon nitride layers can be formed on top of the substrate 12, with each silicon nitride layer having a different Si/N composition ratio.

The forming of the silicon nitride layer preferably includes forming a layer with the flow rate ratio of ammonia gas relative to silane gas set to approximately 0.5 or greater, and forming a layer with the flow rate ratio of ammonia gas relative to silane gas set to less than approximately 0.5. By using this method, a layer with a Si/N composition ratio of not more than approximately 1.4, and a layer with a Si/N composition ratio that is greater than approximately 1.4 can be formed as the silicon nitride layers. Furthermore, laminating the silicon nitride layer 14 to the substrate 12 with the above flow rate ratio set to approximately 0.5 or greater, and then laminating the silicon nitride layer 16 to the top of the silicon nitride layer 14 with the flow rate ratio set to less than approximately 0.5 is preferred. This enables a layer with a Si/N composition ratio of not more than approximately 1.4 to be laminated to the substrate 12 as the silicon nitride layer 14, and a layer with a Si/N composition ratio that is greater than approximately 1.4 to be laminated to the top of the silicon nitride layer 14 as the silicon nitride layer 16.

Furthermore, the film thickness of each layer formed with the above flow rate ratio set to less than approximately 0.5 is preferably not more than approximately 50 nm, and is even more preferably not more than approximately 30 nm.

According to this method, by laminating a silicon nitride layer with a high degree of optical transmittance formed using ammonia gas, and a silicon nitride layer of a film thickness that causes minimal deterioration in the optical transmittance, which is formed with either no ammonia gas or a reduced level of ammonia gas, and with the aforementioned Si/N composition ratio and/or the values for the aforementioned A/B and A/C set to appropriate values, the silicon nitride layer that is formed with either no ammonia gas or a reduced level of ammonia gas may function as an oxidation prevention layer, thereby preventing oxidation of the silicon nitride layer formed using ammonia gas, and the interface between the two layers may suppress pinhole formation and may enable the barrier properties to be maintained at a high level.

Furthermore, according to this method, because the silicon nitride layer formed using ammonia gas contributes to the film thickness, a barrier film with favorable coating properties can be formed. Moreover, because the layers are formed from the same materials, there may be almost no interfacial diffusion of moisture or oxygen, and because the oxidation rate of the silicon nitride layer formed using ammonia gas is extremely slow, there may be almost no need to consider oxidation within the in-plane direction of the substrate, meaning treatment of the edges of the barrier film may be unnecessary, which ensures a high level of productivity. Furthermore, by overlaying another silicon nitride layer formed using ammonia gas, and an ultra thin silicon nitride layer formed with either no ammonia gas or a reduced level of ammonia gas, the barrier properties can be improved even further. Moreover, even when the silicon nitride layers are formed at a low substrate temperature such as room temperature, the barrier properties can be maintained for considerably long periods under conditions of high temperature and high humidity, meaning a barrier film can be formed in situations where heat resistance is a problem, or on all manner of substrates for which shape restrictions prevent the temperature from being raised.

Furthermore, in the forming of the silicon nitride layer, the silicon nitride layers may be formed under continuously changing conditions by altering the flow rate ratio while the carrier gas flows continuously. This enables the formation of a graded junction in which the composition of the silicon nitride film varies in a continuous manner.

In a plasma CVD method, a silicon nitride layer is typically formed via a cycle of vacuum evacuation, gas introduction, vacuum degree adjustment, plasma formation, gas supply halt, and vacuum evacuation. However, if a plurality of silicon nitride layers are formed with this cycle repeated for each layer, then the productivity may deteriorate. Accordingly, the process of halting the gas supply and then re-introducing the gas between each layer is omitted, and once the gas introduction is started, the flow rate ratio of ammonia gas to silane gas is altered to enable the formation of a silicon nitride layer that varies in a continuous manner, thereby enabling a barrier film according to the present embodiment to be formed at a high level of productivity. During this method, the electrical power used for forming the plasma may be applied continuously, or may be switched off while the gas flow rates are altered and then subsequently reapplied. However, if the total flow rate varies considerably when the flow rate ratio of ammonia gas relative to silane gas is altered, then problems may arise, including requiring considerable time to readjust the degree of vacuum, loss of the plasma in those situations where the electrical power used for forming the plasma is applied continuously, and large variations in the film quality. Consequently, by also supplying a carrier gas in a continuous manner and at a much larger flow rate than the silane and ammonia gases, variations in the total flow rate can be suppressed, readjustments of the degree of vacuum can be made rapidly, and a stable plasma can be achieved. Accordingly, in the forming of the silicon nitride layer, the flow rate of the carrier gas is preferably set to at least approximately 10 times the combined flow rate of the silane gas and the ammonia gas. Furthermore, variations in the total gas flow rate are preferably suppressed to not more than approximately 10%. Variations in the flow rate ratio are preferably conducted by switching the ammonia gas on and off. This means that in a continuous production in which the flow rate ratio is varied continuously, variations in the total flow rate can be suppressed, enabling readjustments of the degree of vacuum to be made rapidly.

In terms of not having a significant effect on the properties of the silicon nitride film, the carrier gas is preferably at least one of nitrogen gas, a rare gas and hydrogen gas. From the viewpoint of factors such as ease of handling, at least one of nitrogen gas and a rare gas is preferred, and in terms of factors such as cost, the use of nitrogen gas is particularly desirable. Furthermore, by using nitrogen gas as the carrier gas, the nitrogen gas can also function as a nitrogen source, enabling the Si/N composition ratio and the values for A/B and A/C within the silicon nitride layers to be controlled in a stable manner within the aforementioned ranges.

Figure 4:
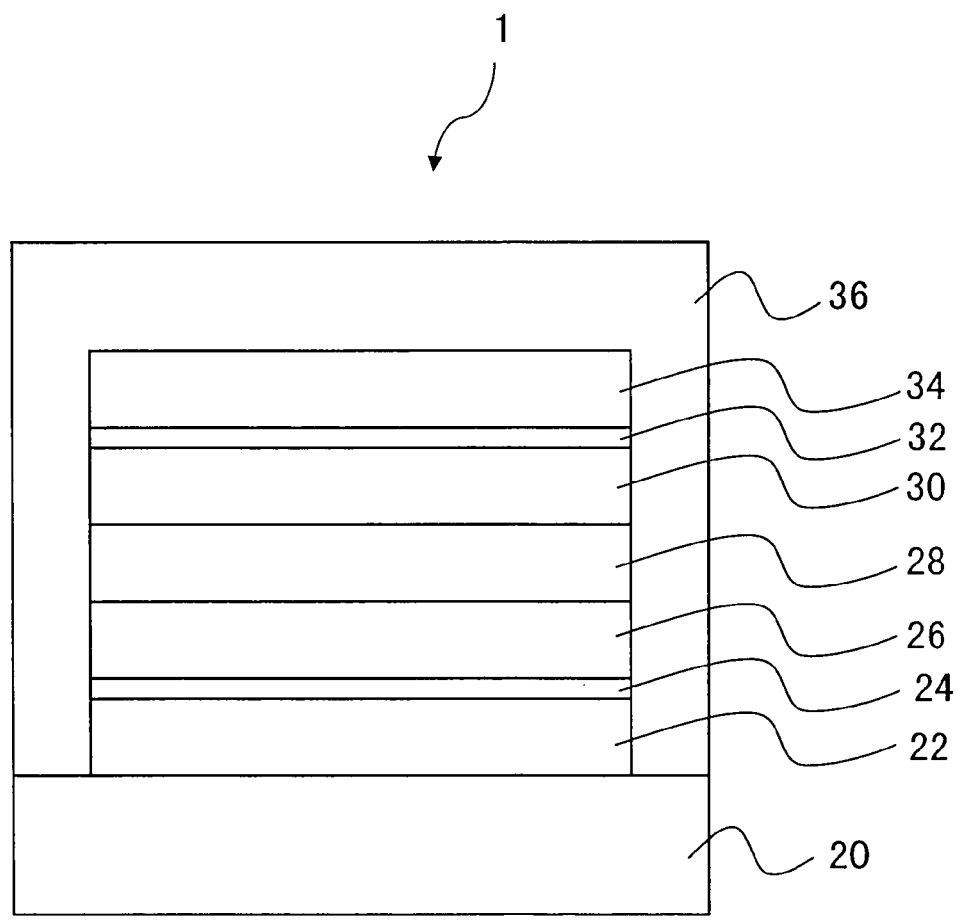
FIG. 4 is a schematic cross-sectional view showing an example of the structure of an organic EL element containing a barrier film according to an embodiment of the present invention.

A barrier film according to the present embodiment can be used favorably as a protective film for a functional element, and the use of the barrier film with a functional element is described below using an organic EL element as an example of the functional element. However, the functional element is not restricted to organic EL elements. FIG. 4 shows a schematic illustration of the cross-sectional structure of an organic EL element according to this embodiment. In summary, this organic EL element 1 is prepared by forming a hole injection electrode 22, a hole injection layer 24, a hole transport layer 26, a light-emitting layer 28, an electron transport layer 30, an electron injection layer 32, and an electron injection electrode 34, in that order, on top of a substrate 20, and also includes a barrier film according to the present embodiment as a protective film 36 for the entire element.

However, the organic EL element according to the present embodiment need not necessarily have the structure described above, and a variety of other structures, such as a structure with no electron injection layer or electron transport layer, can also be adopted.

There are no particular restrictions on the substrate 20, provided it is substantially transparent, and examples include glass and plastics such as polyethylene terephthalate, ester resins, acrylic resins, fluororesins and epoxy resins. Furthermore, substrates in which a barrier film according to the present embodiment or a barrier film of $Si_3N_4$ or $SiO_2$ or the like is formed on the surface of a plastic substrate may also be used.

The hole injection electrode 22 is formed on top of the substrate 20 using a metal oxide-based transparent electrode material with a large work function such as ITO (Indium Tin Oxide). Transparent electrodes containing indium oxide such as ITO and IZO (Indium Zinc Oxide) are preferred as the hole injection electrode 22, but transparent electrodes containing zinc oxide such as AZO (Aluminum Zinc Oxide) and GZO (Gallium Zinc Oxide) may also be used. The film thickness of the hole injection electrode 22 is preferably within a range from approximately 10 nm to approximately 500 nm.

Between the hole injection electrode 22 and the hole transport layer 26, a nickel oxide layer (NiO film) or the like is formed as the hole injection layer 24. In order to prevent high voltages, the resistivity of the inserted hole injection layer 24 is preferably not more than approximately 0.5 Ωcm, and is even more preferably not more than approximately 0.3 Ωcm. One simple method of achieving this type of resistivity is by conducting film formation using a sputtering method at a low substrate temperature of not more than approximately 150° C.

Formation of the ITO film of the hole injection electrode 22 and the NiO film of the hole injection layer 24 is preferably conducted using a sputtering method such as high frequency (RF) magnetron sputtering, but the present invention is not restricted to this type of method, and a variety of other methods such as reactive sputtering methods, reactive vapor deposition methods, CVD methods, sol-gel methods, and spray methods may also be used.

The film thickness of the hole injection layer 24 is preferably within a range from approximately 1 nm to approximately 10 nm. If the film thickness of the hole injection layer 24 is less than approximately 1 nm, then formation of a continuous film may become problematic, whereas if the film thickness exceeds approximately 10 nm, then an element half life that is approximately 70% or greater of the maximum value may be unattainable in practical applications.

Furthermore, prior to formation of an element on top of the hole injection layer 24, the surface of the hole injection layer 24 is preferably subjected to a plasma treatment such as an oxygen plasma treatment or Ar plasma treatment.

There are no particular restrictions on the material used for the hole transport layer 26 that is formed on top of the hole injection layer 24, provided the material possesses a hole transport function, and examples of materials that can be used include amine compounds such as triphenylamine multimers. Specific examples of materials that can be used include α-NPD (4,4'-bis[N-(1-naphthyl)-N-phenyl-amino]biphenyl) and TPTE (triphenylamine tetramer). The film thickness of the hole transport layer 26 is preferably within a range from approximately 1 nm to approximately 300 nm.

The light-emitting layer 28 contains an organic light-emitting material that is best suited to the color and luminance that are required. The light-emitting layer 28 may exist in any of a variety of forms, including single layers containing the light-emitting material, mixed layers containing a small quantity of the light-emitting material as a guest material that is used to dope a host material, and multilayer structures prepared by laminating different light-emitting layers together, which are able to generate multi-color light emission. Organic compounds that emit fluorescence may be used for the light-emitting layer 28, but this is not a restriction, and for example, organometal complexes and the like that emit phosphorescence may also be used. In order to regulate the emitted color and increase the light emitting efficiency, doping of the light-emitting layer 28 with organic molecules is also desirable. The film thickness of the light-emitting layer 28 is preferably within a range from approximately 1 nm to approximately 300 nm.

In those cases where the organic EL element is a white light-emitting element, the white color can be achieved by color addition using, for example, blue and red (or orange) layers as the light-emitting materials. Furthermore, in the case of an RGB coloring system, different light-emitting materials can be used for each of the RGB colors.

Examples of light-emitting materials that can be used include an aluminum quinolinol complex ($Alq_3$: tris(8-hydroxyquinolinato)aluminum (III)) and DPVBi (4,4'-bis[(2,2-diphenyl)vinyl-1-yl]-1,1'-biphenyl). Alternatively, this $Alq_3$ may be used as a host material, and combined with another light-emitting material as a dopant. Other materials with a light-emitting function may, of course, also be used.

Examples of fluorescent light-emitting dopant materials include, in the case of blue fluorescence, bis[4-(N,N-diphenylamino)styryl]-9,10-anthracene. An example of an orange fluorescent material is DCJTB (4-(dicyanomethylene)-2-t-butyl-6-(1,1,7,7-tetramethyljulolidyl-9-enyl)-4H-pyran).

Furthermore, a combination of a phosphorescent host material and a dopant material may also be used as the light-emitting material. A compound containing a carbazole group can be used as the host material, such as bipolar 4,4'-N,N'-dicarbazole-biphenyl (CBP). Furthermore, the use of 4,4',4''-tris(carbazolyl)-triphenylamine (TCTA), which exhibits hole transport properties, is also possible.

Examples of the dopant material, in the case of blue phosphorescence, include FIrpic (Iridium (III) bis(2-(4,6-difluorophenyl)pyridinato-$N,C^2$) picolinate). An example of a green phosphorescent material is $Ir(ppy)_3$ (tris(2-phenylpyridine) iridium (III)). An example of a red phosphorescent material is $Ir(piq)_3$ (tris(2-phenylisoquinoline) iridium (III)).

There are no particular restrictions on the material used for the electron transport layer 30, provided the material has an electron transport function, and an example of a material that can be used is the above aluminum quinolinol complex ($Alq_3$: tris (8-hydroxyquinolinato) aluminum (III)). The film thickness of the electron transport layer 30 is preferably within a range from approximately 1 nm to approximately 200 nm.

Furthermore, although not absolutely necessary, a hole blocking layer may be formed between the light-emitting layer 28 and the electron transport layer 30. If a hole blocking layer is formed, then for example, when a material with hole transport properties such as TCTA is used as a phosphorescent light-emitting host, hole leakage from the light-emitting layer 28 into the electron injection electrode 34 can be more reliably blocked, and in those cases where $Alq_3$ or the like is used for the electron transport layer 30, potential problems such as holes leaking into the electron transport layer 30 and causing light emission from the $Alq_3$, or an inability to confine the holes within the light-emitting layer 28, resulting in a reduction in the light-emitting efficiency, can be better prevented. Examples of materials that are used for the hole blocking layer include TPBI (2,2',2''-(1,3,5-phenylene)tris(1- phenyl-1H-benzimidazole)), bathocuproine (BCP), and BAl$_q$ (Aluminum (III) bis(2-methyl-8-quinolinato) 4-phenylphenolate). The film thickness of the hole blocking layer is preferably within a range from approximately 0.1 nm to approximately 100 nm, and is even more preferably within a range from approximately 0.1 nm to approximately 30 nm.

An electron injection layer 32 such as a LiF layer is formed on top of the electron transport layer 30, followed by an electron injection electrode 34 such as Al. Other examples of materials that can be used as the electron injection electrode 34, besides Al, include Mg—Ag alloys and Al—Li alloys. Furthermore, an electron injection electrode 34 may be provided as a single layer without using an electron injection layer 32. The electron injection electrode 34 is preferably formed using a vacuum deposition method, although the electrode may also be formed using a sputtering method or ion plating method. The film thickness of the electron injection layer 32 is preferably within a range from approximately 0.1 nm to approximately 1 nm. The film thickness of the electron injection electrode 34 is preferably within a range from approximately 0.1 nm to approximately 100 nm.

The barrier film described above can be used as the protective film 36. In the case of an organic EL, the film thickness of the protective film 36 is preferably within a range from approximately 100 nm to approximately 10 μm, and is even more preferably within a range from approximately 500 nm to approximately 5 μm.

The prepared element is preferably subjected to an annealing treatment at a temperature of approximately 80° C. or higher. By subjecting the prepared element to an annealing treatment, the inorganic film/organic film interfacial adhesion can be improved, thereby improving the properties of the element.

By using a barrier film according to an embodiment of the present invention, an organic EL element with a high degree of efficiency and a long lifespan can be provided. Furthermore, because a resin substrate can be used as the substrate, a flexible organic EL element can be provided.

An organic EL element according to this embodiment can be used favorably in organic EL displays for display elements, computers, televisions, mobile telephones, digital cameras, PDAs, and car navigation systems; as a light source for backlights and the like; and for illumination, interiors, signs, traffic signals, and billboards and the like.

EXAMPLES

The present invention is described in specific detail below using a series of examples and comparative examples, but the present invention is in no way limited by the examples presented below.

Example 1

As an example 1 of the present invention, a silicon nitride layer of thickness 300 nm is formed on both a Si substrate and a quartz substrate using a flow rate ratio of ammonia gas relative to silane gas of 1, and in each case, a silicon nitride layer of thickness 15 nm is then formed on top using a flow rate ratio of ammonia gas relative to silane gas of 0, thereby forming a silicon nitride film and completing preparation of a sample. All of the silicon nitride layers are formed using a parallel plate RF plasma CVD apparatus (PD-3802L, manufactured by Samco, Inc.). The film formation conditions for the silicon nitride layer formed with the flow rate ratio of ammonia gas relative to silane gas set to 1 include a silane gas flow rate of 60 sccm, an ammonia gas flow rate of 60 sccm, a nitrogen gas flow rate of 1,600 sccm, a gas pressure of 106 Pa, RF power of 300 W, a substrate temperature of 100° C., and a film formation rate of approximately 100 nm/minute. With the exception of altering the ammonia gas flow rate to 0 sccm and setting the film formation rate to approximately 80 nm/minute, the film formation conditions for the silicon nitride layer formed with the flow rate ratio of ammonia gas relative to silane gas set to 0 are the same as the film formation conditions for the silicon nitride layer formed with the flow rate ratio of ammonia gas relative to silane gas set to 1.

Comparative Example 1

As a comparative example 1, a silicon nitride layer of thickness 315 nm is formed on both a Si substrate and a quartz substrate using a flow rate ratio of ammonia gas relative to silane gas of 1, thereby forming a silicon nitride film and completing preparation of a sample in each case. The film formation conditions are the same as the example 1.

Comparative Example 2

As a comparative example 2, a silicon nitride layer of thickness 315 nm is formed on both a Si substrate and a quartz substrate using a flow rate ratio of ammonia gas relative to silane gas of 0, thereby forming a silicon nitride film and completing preparation of a sample in each case. The film formation conditions are the same as the example 1.

In the example 1 and the comparative examples 1 and 2, when the Si/N composition ratio is determined for each of the Si substrate samples by compositional analysis using an X-ray photoelectron spectroscopic method (XPS), the value for the silicon nitride layer of the example 1 that is formed with the flow rate ratio of ammonia gas relative to silane gas set to 1 is Si/N=1.18, whereas the value for the silicon nitride layer for which the ammonia gas flow rate ratio is 0 is Si/N=1.82. The value for the silicon nitride layer of the comparative example 1 that is formed with the flow rate ratio of ammonia gas relative to silane gas set to 1 is Si/N=1.18, whereas the value for the silicon nitride layer of the comparative example 2 that is formed with the ammonia gas flow rate ratio set to 0 is Si/N=1.82. The XPS measurements are conducted using a Quantera SXM apparatus manufactured by ULVAC PHI, Inc., using monochromated Al Kα as the X-ray source, and with an analysis region of approximately 100 μmφ.

Figure 5A:
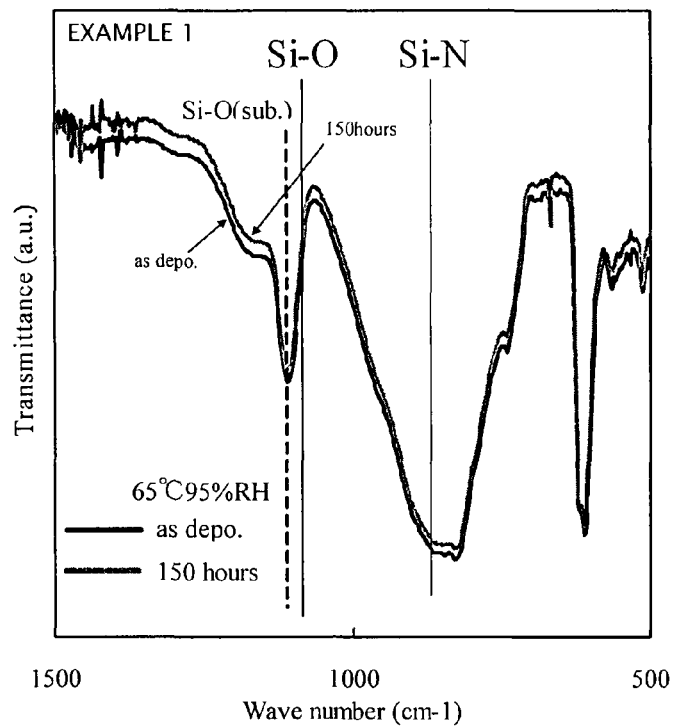
FIG. 5A is a diagram showing an FT-IR spectrum of a sample on a Si substrate in an example 1 of the present invention.
Figure 5B:
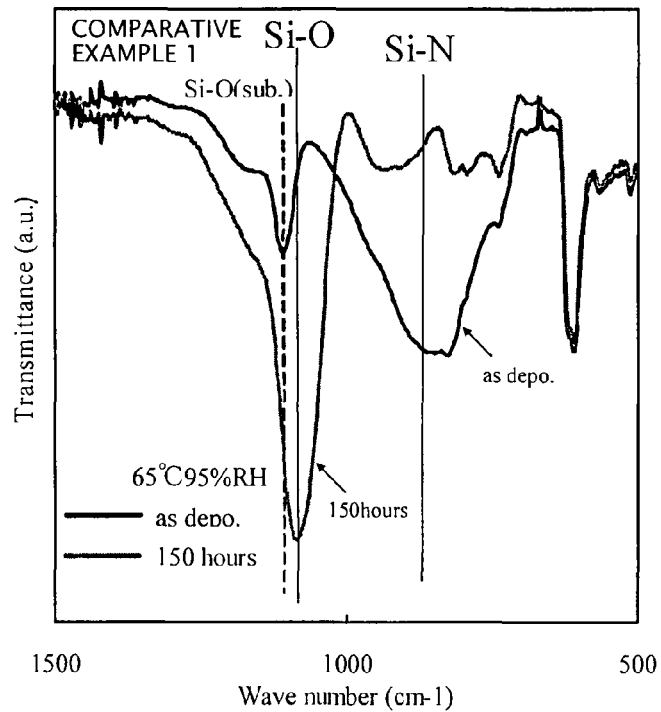
FIG. 5B is a diagram showing an FT-IR spectrum of a sample on a Si substrate in a comparative example 1 of the present invention.
Figure 5C:
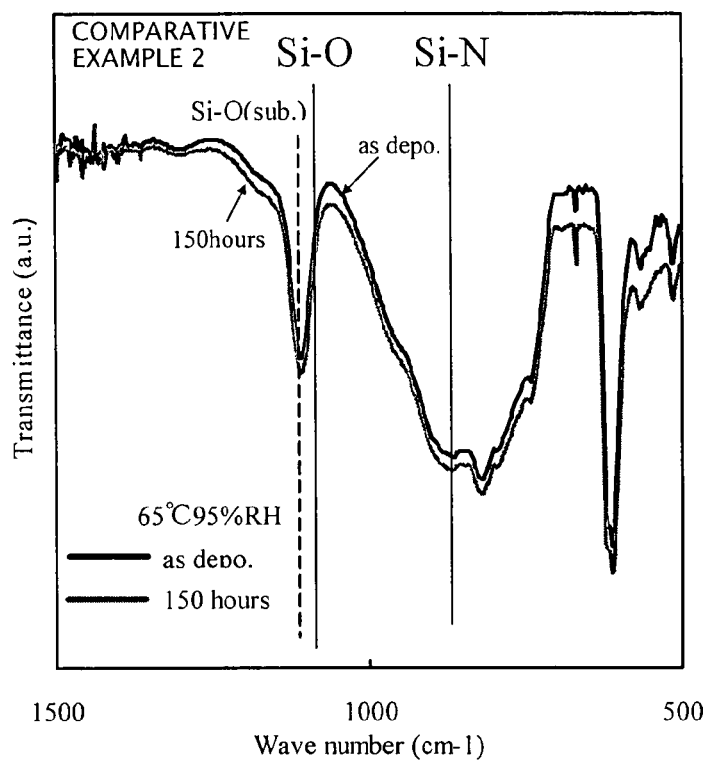
FIG. 5C is a diagram showing an FT-IR spectrum of a sample on a Si substrate in a comparative example 2 of the present invention.

The results of conducting FT-IR analysis of the Si substrate samples from the example 1 and the comparative examples 1 and 2 are shown in FIGS. 5A through 5C. Measurements are conducted by transmission measurement using an FT-IR AVATAR36, manufactured by Nicolet Corporation. Values are determined for the peak intensity ratio A/B of N—H stretching vibration in the vicinity of 3350 cm$^{-1}$/Si—N stretching vibration in the vicinity of 860 cm$^{-1}$, and the peak intensity ratio A/C of N—H stretching vibration in the vicinity of 3350 cm$^{-1}$/Si—H stretching vibration in the vicinity of 2160 cm$^{-1}$. For the silicon nitride layer of the example 1 that is formed with the flow rate ratio of ammonia gas relative to silane gas set to 1, A/B=0.13 and A/C=0.49, whereas for the silicon nitride layer for which the ammonia gas flow rate ratio is 0, A/B=0.025 and A/C=0.12. For the silicon nitride layer of the comparative example 1 that is formed with the flow rate ratio of ammonia gas relative to silane gas set to 1, A/B=0.13 and A/C=0.49, whereas for the silicon nitride layer of the comparative example 2 that is formed with the ammonia gas flow rate ratio set to 0, A/B=0.025 and A/C=0.12. FIG. 5 shows the initial spectrum and the spectrum following storage for 150 hours under an atmosphere at 65° C. and 95% RH. In the example 1 and the comparative example 2, the spectra show almost no variation, and even after storage for 1,000 hours, the spectrum remains unchanged. In contrast, in the comparative example 1, it is evident that the peak attributable to Si—N bonds almost disappears completely, whereas the peak attributable to Si—O bonds becomes more intense. In other words, it is clear that the silicon nitride film is oxidizing, causing a deterioration in the barrier properties.

Figure 6:
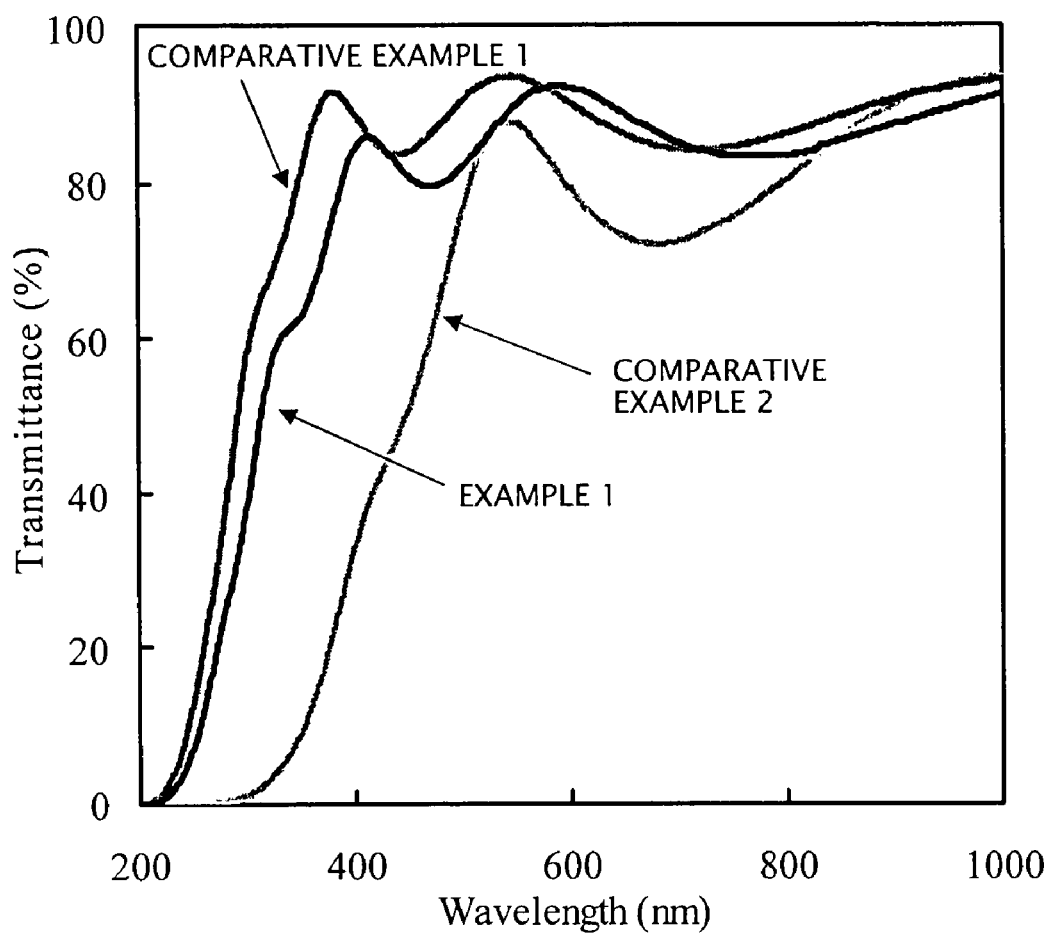
FIG. 6 is a diagram showing optical transmission spectra for samples on quartz substrates in the example 1 and the comparative examples 1 and 2.

Furthermore, the optical transmission spectra for the quartz substrate samples are shown in FIG. 6. In the example 1 and the comparative example 1, the optical transmittance in the visible light region is approximately 80% or greater, whereas in the comparative example 2, the optical transmittance decreases, and is approximately 70% in the red light region and approximately 50% in the blue light region. The above results show that whereas the example 1 exhibits favorable levels of both barrier properties and optical transmittance, the comparative example 1 exhibits inferior barrier properties and the comparative example 2 exhibits inferior optical transmittance, thus confirming the effects provided by the structure of the example 1.

Example 2

Figure 7:
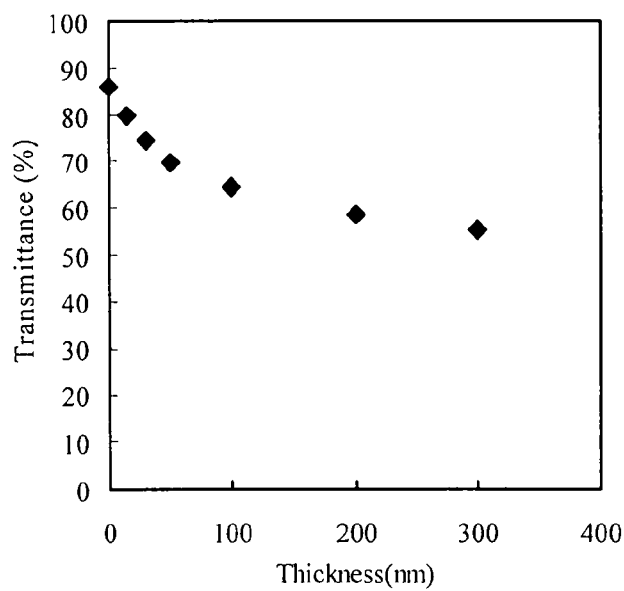
FIG. 7 is a graph showing the optical transmittance at a wavelength of 460 nm when the film thickness is altered for a silicon nitride layer that is prepared with the structure of the example 1, and with the flow rate ratio of ammonia gas relative to silane gas set to 0.

For the structure of the example 1, the results of measuring the optical transmittance at a wavelength of 460 nm for varying film thickness values (0, 15, 30, 50, 100, 200, 300 nm) for the silicon nitride layer formed with the flow rate ratio of ammonia gas relative to silane gas set to 0 are shown in FIG. 7. It is evident that in order to ensure an optical transmittance of at least 70% in the blue light region, the film thickness is not more than 50 nm, whereas in order to ensure an optical transmittance of at least 75%, the film thickness is not more than 30 nm. Provided the film thickness of the silicon nitride layer formed with the flow rate ratio of ammonia gas relative to silane gas set to 0 is at least 1 nm, a high level of barrier properties can be obtained.

Example 3

Figure 8:
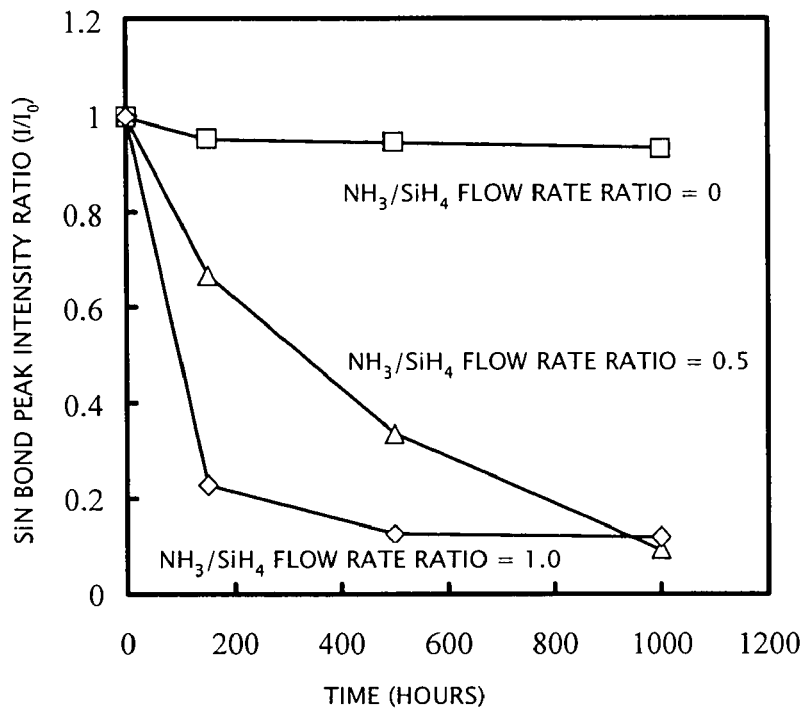
FIG. 8 is a graph showing how the Si—N bond peak intensity ratio within a FT-IR spectrum varies upon storage at 65° C. and 95% RH when a silicon nitride layer prepared with the flow rate ratio of ammonia gas relative to silane gas set to 0 in a structure of the example 1 is replaced with a silicon nitride layer in which the flow rate ratio of ammonia gas relative to silane gas has been altered.

FIG. 8 shows how the Si—N bond peak intensity ratio within a FT-IR spectrum varies upon storage at 65° C. and 95% RH when the silicon nitride layer formed with the flow rate ratio of ammonia gas relative to silane gas set to 0 in the structure of the example 1 is replaced with a silicon nitride layer in which the flow rate ratio of ammonia gas relative to silane gas has been altered. The flow rate ratio of 0 represents the same structure as the example 1, whereas the flow rate ratio of 1 represents the same structure as the comparative example 1. When the flow rate ratio is 0.5, the Si—N peak intensity disappears after 1,000 hours, and this result indicates that provided the flow rate ratio is less than 0.5, some residual Si—N bonds can be retained. In other words, it is clear that provided the flow rate ratio of ammonia gas relative to silane gas is less than 0.5, the barrier film effects can be realized.

Example 4

As an example 4 of the present invention, a sample with the same structure as the example 1 is prepared with the substrate temperature set to 180° C. For the silicon nitride layer formed with the flow rate ratio of ammonia gas relative to silane gas set to 1, Si/N=1.17, whereas for the silicon nitride layer formed with the ammonia gas flow rate ratio set to 0, Si/N=1.75. For the silicon nitride layer formed with the flow rate ratio of ammonia gas relative to silane gas set to 1, A/B=0.09 and A/C=0.35, whereas for the silicon nitride layer formed with the ammonia gas flow rate ratio set to 0, A/B=0.015 and A/C=0.05.

Comparative Example 3

As a comparative example 3, a sample with the same structure as the comparative example 1 is prepared with the substrate temperature set to 180° C. For the silicon nitride layer formed with the flow rate ratio of ammonia gas relative to silane gas set to 1, Si/N=1.17. For the silicon nitride layer formed with the flow rate ratio of ammonia gas relative to silane gas set to 1, A/B=0.09 and A/C=0.35.

Example 5

As an example 5, a sample with the same structure as the example 1 is prepared with the substrate temperature set to room temperature (25° C.). For the silicon nitride layer formed with the flow rate ratio of ammonia gas relative to silane gas set to 1, Si/N=1.21, whereas for the silicon nitride layer formed with the ammonia gas flow rate ratio set to 0, Si/N=1.92. For the silicon nitride layer formed with the flow rate ratio of ammonia gas relative to silane gas set to 1, A/B=0.18 and A/C=0.8, whereas for the silicon nitride layer formed with the ammonia gas flow rate ratio set to 0, A/B=0.08 and A/C=0.30.

Comparative Example 4

As a comparative example 4, a sample with the same structure as the comparative example 1 is prepared with the substrate temperature set to room temperature (approximately 25° C.). For the silicon nitride layer formed with the flow rate ratio of ammonia gas relative to silane gas set to 1, Si/N=1.21. For the silicon nitride layer formed with the flow rate ratio of ammonia gas relative to silane gas set to 1, A/B=0.18 and A/C=0.8.

Comparative Example 5

As a comparative example 5, a sample with the same structure as the comparative example 1 is prepared with the substrate temperature set to 230° C. For the silicon nitride layer formed with the flow rate ratio of ammonia gas relative to silane gas set to 1, Si/N=1.15. For the silicon nitride layer formed with the flow rate ratio of ammonia gas relative to silane gas set to 1, A/B=0.07 and A/C=0.28.

Figure 9:
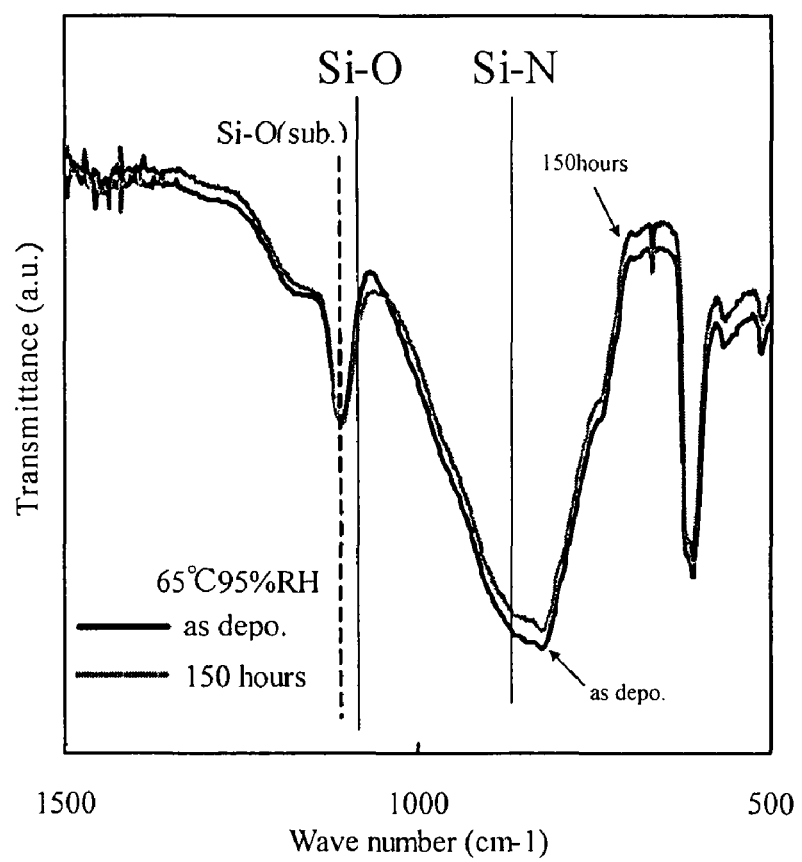
FIG. 9 is a diagram showing an FT-IR spectrum of a sample prepared by forming a silicon nitride layer of thickness 300 nm on a Si substrate at a substrate temperature of 230° C., with the flow rate ratio of ammonia gas relative to silane gas set to 1.

When the samples from the examples 4 and 5, and the comparative examples 3 and 4 are stored for 150 hours under an atmosphere at 65° C. and 95% RH and subsequently subjected to FT-IR analysis, it is evident that whereas in the samples of the comparative examples 3 and 4, the silicon nitride films are almost completely oxidized, the silicon nitride film of the example 4 undergoes almost no oxidation, and while the silicon nitride film of the example 5 undergoes slight oxidation, the peaks attributable to the original silicon nitride film are still visible, indicating that compared with the comparative examples 3 and 4, the barrier properties of the examples 4 and 5 are superior, thus confirming the barrier film effects. However, in the case of the substrate temperature of 230° C. used in the comparative example 5, the silicon nitride layer formed with the flow rate ratio of ammonia gas relative to silane gas set to 1 undergoes almost no oxidation even after storage for 150 hours under an atmosphere at 65° C. and 95% RH, indicating that a laminated structure may be unnecessary, and confirming that the substrate temperature range for which the barrier film effects are obtained is from not less than room temperature to not more than 200° C. The results of FT-IR analysis for the comparative example 5 are shown in FIG. 9.

Comparative Example 6

Next is an example showing the importance of the interface between the silicon nitride layers formed with different flow rate ratios of ammonia gas relative to silane gas. A sample is prepared by forming a silicon nitride layer of thickness 300 nm on top of a Si substrate using a flow rate ratio of ammonia gas relative to silane gas of 1, subsequently forming a CNx:H film of 200 nm, and then forming another silicon nitride layer of thickness 15 nm on top using a flow rate ratio of ammonia gas relative to silane gas of 0. In other words, although this sample employs a plurality of silicon nitride layers formed with different flow rate ratios of ammonia gas relative to silane gas, no common interface exists between the silicon nitride layers. The film formation conditions for the silicon nitride layers are the same as those described for the example 1, and the CNx:H film is formed using a RF plasma polymerization method including a methane gas flow rate of 40 sccm, a nitrogen gas flow rate of 40 sccm, a gas pressure of 100 Pa, RF power of 300 W, and a substrate temperature of room temperature. From the observation that the silicon nitride film undergoes oxidation when this sample is stored for 150 hours under an atmosphere at 65° C. and 95% RH, it is evident that in order to achieve the barrier film effects, a joint interface is required between the silicon nitride layers formed with different flow rate ratios of ammonia gas relative to silane gas. The same effects are achieved regardless of whether the form of the interface is a stepwise junction or a graded junction.

Example 6

Figure 10A:
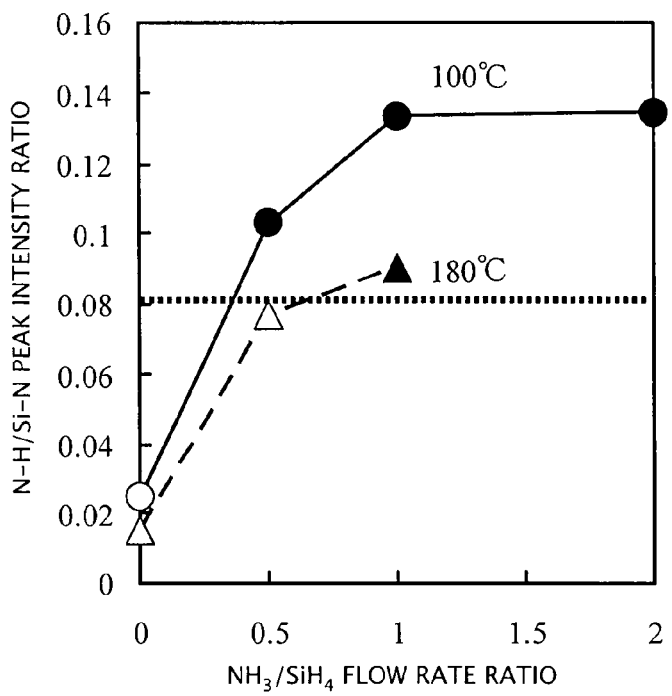
FIG. 10A is a graph showing the ammonia gas/silane gas flow rate ratio dependency of the A/B ratio in the FT-IR spectrum of a silicon nitride single layer.
Figure 10B:
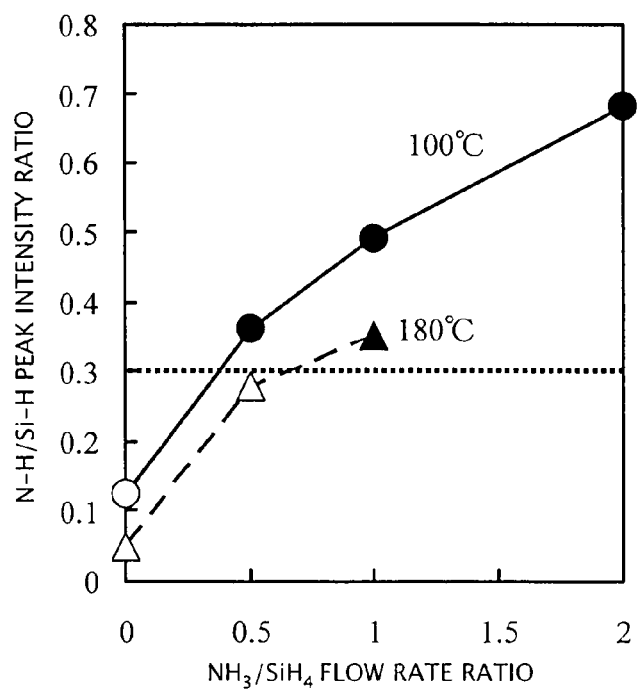
FIG. 10B is a graph showing the ammonia gas/silane gas flow rate ratio dependency of the A/C ratio in the FT-IR spectrum of a silicon nitride single layer.

As follows is a description of the prescriptions relating to the peak intensity ratio of N—H stretching vibration in the vicinity of 3350 cm$^{-1}$/Si—N stretching vibration in the vicinity of 860 cm$^{-1}$=A/B, and the peak intensity ratio of N—H stretching vibration in the vicinity of 3350 cm$^{-1}$/Si—H stretching vibration in the vicinity of 2160 cm$^{-1}$=A/C. FIGS. 10A and 10B show the ammonia gas/silane gas flow rate ratio dependency of A/B (the peak intensity ratio for N—H/Si—N) and A/C (the peak intensity ratio for N—H/Si—H) respectively in the FT-IR spectrum of a silicon nitride single layer. Measurement is conducted using an FT-IR AVATAR36, manufactured by Nicolet Corporation. The circles in the figures represent values when film formation is conducted at a substrate temperature of 100° C., and the triangles represent values when film formation is conducted at a substrate temperature of 180° C. Furthermore, when samples are prepared by forming a silicon nitride layer of thickness 300 nm on a Si substrate using a flow rate ratio of ammonia gas relative to silane gas of 1 (A/B=0.13, A/C=0.5), and then forming a silicon nitride layer of thickness 15 nm on top using various conditions, and these samples are then stored for 1,000 hours under an atmosphere at 65° C. and 95% RH, samples that undergo oxidation are represented by black points in the figures, whereas samples that do not oxidize are represented by white points. In other words, it is evident that regardless of the ammonia gas/silane gas flow rate ratio, the value of A/B is preferably not more than 0.08, and the value of A/C is preferably not more than 0.3.

Example 7

Figure 11:
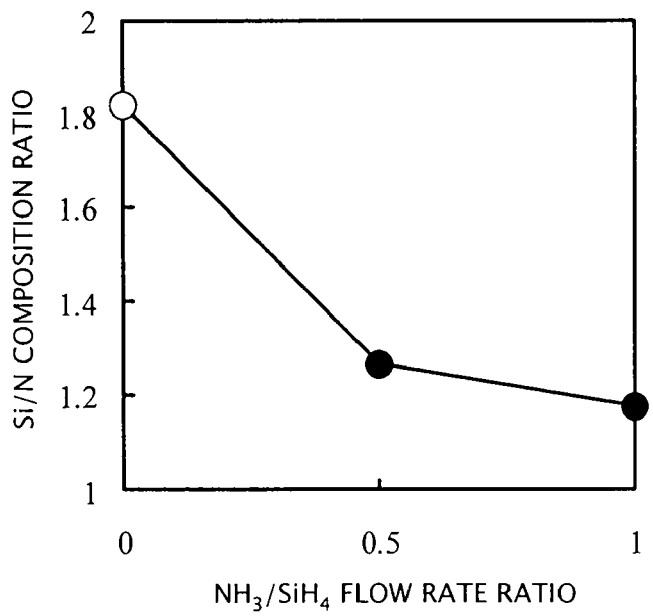
FIG. 11 is a graph showing the ammonia gas/silane gas flow rate ratio dependency of the Si/N composition ratio.

Next is a description of the prescriptions relating to the Si/N composition ratio determined from compositional analysis using an X-ray photoelectron spectroscopic method (XPS). FIG. 11 is a graph showing the ammonia gas/silane gas flow rate ratio dependency of the Si/N composition ratio. Measurements are conducted using a Quantera SXM apparatus manufactured by ULVAC PHI, Inc., using monochromated Al Kα as the X-ray source, and with an analysis region of approximately 100 μmφ. Furthermore, when samples are prepared by forming a silicon nitride layer of thickness 300 nm on a Si substrate using a flow rate ratio of ammonia gas relative to silane gas of 1 (Si/N composition ratio: 1.2), and then forming a silicon nitride layer of thickness 15 nm on top using various conditions, and these samples are then stored for 1,000 hours under an atmosphere at 65° C. and 95% RH, samples that undergo oxidation are represented by black points in the figure, whereas samples that do not oxidize are represented by white points. The change-point from samples that oxidize to those that do not oxidize occurs at a Si/N composition ratio between 1.3 and 1.8, and more detailed investigation reveals that under measurement conditions that include storage for 3,000 hours under an atmosphere at 65° C. and 95% RH, oxidation does not occur at a Si/N composition ratio of 1.42, but does occur at 1.35. Accordingly, it is clear that the change-point occurs in the vicinity of Si/N composition ratio=1.4.

Example 8

Table 1 shows the results of conducting compositional analysis in the depth direction from the surface of a sample prepared by forming a silicon nitride layer of thickness 300 nm on a Si substrate using a flow rate ratio of ammonia gas relative to silane gas of 1 (Si/N composition ratio: 1.2), and then forming a silicon nitride layer of thickness 15 nm with a Si/N composition ratio of 1.8. Processing is conducted using Ar$^+$ sputtering, at an accelerating voltage of 1 kV and a sputtering rate of 2 nm/minute. Measurements are conducted using a Quantera SXM apparatus manufactured by ULVAC PHI, Inc., using monochromated Al Kα as the X-ray source, and with an analysis region of approximately 100 μmφ. A variation in the Si/N composition ratio is observed that reflects the laminated structure, confirming the necessity of laminating layers with different Si/N composition ratios. Adsorption of water and oxygen and the like is observed at the outermost surface, resulting in a higher proportion of oxygen (O).

TABLE 1

|  | O [atom %] | N [atom %] | Si [atom %] | Si/N |
|---|---|---|---|---|
| Outermost surface | 36 | 19 | 45 | 2.37 |
| 4 nm | 7.9 | 33 | 59 | 1.79 |
| 100 nm | 1.6 | 45 | 53 | 1.18 |

Example 9

In the plasma CVD method, the process of halting the gas supply and then re-introducing the gas between the formation of each silicon nitride layer is omitted, and once the gas introduction is started, the flow rate ratio of ammonia gas relative to silane gas is altered, thereby forming a silicon nitride film that varies in a continuous manner. The quantity of the carrier gas is set to 26 times the flow rate of the silane gas and ammonia gas, and variation in the total gas flow rate is restricted to not more than 3.5%. When structures of the example 1 are formed using both a production method similar to a conventional plasma CVD method, in which each silicon nitride layer is formed via a cycle of vacuum evacuation, gas introduction, vacuum degree adjustment, plasma formation, gas supply halt and vacuum evacuation, and the above production method, the film formation times are 8.2 minutes and 6.2 minutes respectively, indicating a 30% improvement in productivity. Furthermore, following storage for 1,000 hours under an atmosphere at 65° C. and 95% RH, neither sample has oxidized or shown any change in properties, indicating that the above method of production enables the production of a barrier film at a high level of productivity.

Example 10

As follows is a description of examples involving actual application to functional elements. Organic electroluminescent elements, which demand the highest level of barrier properties, are selected as the functional elements.

As an example 10, an organic electroluminescent element is formed as a functional element on top of a glass substrate, and a laminated film structure is then formed that completely covers the organic electroluminescent element, by forming a silicon nitride layer of thickness 1,000 nm on top of the organic electroluminescent element at a substrate temperature of 100° C., using a flow rate ratio of ammonia gas relative to silane gas of 1, and then forming a silicon nitride layer of thickness 15 nm at the same substrate temperature using a flow rate ratio of ammonia gas relative to silane gas of 0. For the silicon nitride layer formed with the flow rate ratio of ammonia gas relative to silane gas set to 1, Si/N=1.18, whereas for the silicon nitride layer formed with the ammonia gas flow rate ratio set to 0, Si/N=1.82. For the silicon nitride layer formed with the flow rate ratio of ammonia gas relative to silane gas set to 1, A/B=0.13 and A/C=0.49, whereas for the silicon nitride layer formed with the ammonia gas flow rate ratio set to 0, A/B=0.025 and A/C=0.12.

The organic electroluminescent element used in this example has a structure obtained by laminating a hole injection electrode, a hole injection layer, a hole transport layer, a light-emitting layer, an electron injection layer, and an electron injection electrode. In this example, ITO is used as the hole injection electrode, copper phthalocyanine (CuPc) is used as the hole injection layer, triphenylamine tetramer (TPTE) is used as the hole transport layer, quinolinol aluminum complex ($Alq_3$) is used as the light-emitting layer, lithium fluoride (LiF) is used as the electron injection layer, and aluminum (Al) is used as the electron injection electrode. With the exception of the ITO film, film formation is conducted in-situ using vacuum deposition methods. The ITO is a commercially available product marketed by Sanyo Vacuum Industries Co., Ltd. as a substrate. The film thickness of each film is ITO: 150 nm, copper phthalocyanine: 10 nm, triphenylamine tetramer: 50 nm, quinolinol aluminum complex: 60 nm, lithium fluoride: 0.5 nm, Al: 100 nm. The shape of the light-emitting region includes six 3 mm square dots.

Comparative Example 7

As a comparative example 7, a sample is prepared in the same manner as the example 10, with the exception of using a silicon nitride film of thickness 1015 nm, prepared using a flow rate ratio of ammonia gas relative to silane gas of 1, as the film that covers the organic electroluminescent element.

Comparative Example 8

As a comparative example 8, a sample is prepared in the same manner as the example 10, with the exception of using a silicon nitride film of thickness 1015 nm, prepared using a flow rate ratio of ammonia gas relative to silane gas of 0, as the film that covers the organic electroluminescent element.

The samples of the example 10 and the comparative examples 7 and 8 are stored for 150 hours under an atmosphere at 65° C. and 95% RH, and when the state of the light-emitting surface is then inspected, the sample of the example 10 shows almost no change in the light-emitting surface, whereas in the sample of the comparative example 7, the light-emitting region decreases to 30% or less of the initial region, and in the sample of the comparative example 8, spot-shaped non-light-emitting regions (with diameters of 1 mm or less) due to pinholes appear in 10 locations. In other words, it is evident that the barrier film is effective as a barrier film for functional elements.

Example 11

As follows is a description showing that resins can be used as the substrate. As an example 11, an epoxy resin substrate manufactured by Nitto Denko Corporation is used as a resin substrate, and a laminated film structure is formed on top of this resin substrate by forming a silicon nitride layer of thickness 15 nm at a substrate temperature of 100° C. using a flow rate ratio of ammonia gas relative to silane gas of 0, and then forming a silicon nitride layer of thickness 1,000 nm at a substrate temperature of 100° C. using a flow rate ratio of ammonia gas relative to silane gas of 1. An organic electroluminescent element that acts as a functional element is then formed on top of this laminated film, and a laminated film structure is then formed that completely covers this organic electroluminescent element, by forming a silicon nitride layer of thickness 1,000 nm at a substrate temperature of 100° C., using a flow rate ratio of ammonia gas relative to silane gas of 1, and then forming a silicon nitride layer of thickness 15 nm at a substrate temperature of 100° C. using a flow rate ratio of ammonia gas relative to silane gas of 0. The organic electroluminescent element used in this example has the same structure as that of the example 10, with the exception that the hole injection electrode is an ITO film formed at room temperature. When the sample of the example 11 is stored for 150 hours under an atmosphere at 65° C. and 95% RH, and the state of the light-emitting surface is then inspected, the sample shows almost no change in the light-emitting surface, indicating that the barrier film can also be applied to resin substrates.

While the present invention has been described with reference to embodiments, it is to be understood that the invention is not limited to the disclosed embodiments. The scope of the following claims is to be accorded the broadest interpretation so as to encompass all modifications, equivalent structures and functions.

What is claimed is:

1. A barrier film formed on top of a substrate, the barrier film formed so as to cover a functional element region fabricated on top of the substrate, or the barrier film formed on both the substrate and the functional element region, the barrier film comprising:
    at least one layer of a silicon nitride film formed by laminating two or more silicon nitride layers having different Si/N composition ratios,
    wherein if, in a Fourier transform infrared absorption spectrum, a peak intensity in a vicinity of 3350 $cm^{-1}$ attributable to a N—H stretching vibration is termed A, a peak intensity in a vicinity of 860 $cm^{-1}$ attributable to a Si—N stretching vibration is termed B, and a peak intensity in a vicinity of 2160 $cm^{-1}$ attributable to a Si—H stretching vibration is termed C, then the silicon nitride film includes a layer for which the A/B value is not more than approximately 0.08 and the A/C value is not more than approximately 0.3, and a different layer, and a film thickness of a single layer of the layer for which the A/B value is not more than approximately 0.08 and the A/C value is not more than approximately 0.3 is not more than approximately 50 nm.

2. The barrier film according to claim 1, wherein the silicon nitride film is formed by laminating a layer for which the Si/N composition ratio is not more than approximately 1.4 and a layer for which the Si/N composition ratio is greater than approximately 1.4, and a film thickness of a single layer for which the Si/N composition ratio is greater than approximately 1.4 is not more than approximately 50 nm.

3. The barrier film according to claim 1, wherein the barrier film is formed at a substrate temperature of not more than approximately 200° C.

4. The barrier film according to claim 1, wherein the substrate is at least one of a glass, a resin and a semiconductor, and the functional element is an electronic functional element or an optical functional element.

5. The barrier film according to claim 4, wherein the electronic functional element is an organic electronic element.

6. The barrier film according to claim 5, wherein the organic electronic element is at least one of an organic electroluminescent element, an organic transistor, an organic solar cell, a liquid crystal display element, and an electronic paper.

* * * * *